(12) United States Patent
Hiura et al.

(10) Patent No.: US 7,473,991 B2
(45) Date of Patent: Jan. 6, 2009

(54) SEMICONDUCTOR DEVICE AND ELECTRIC APPARATUS

(75) Inventors: Shigeru Hiura, Tokyo (JP); Takaya Kitahara, Sagamihara (JP); Masanori Kinugasa, Yokohama (JP); Akira Takiba, Kawasaki (JP); Masaru Mizuta, Kamakura (JP); Kiyoyasu Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 11/614,426

(22) Filed: Dec. 21, 2006

(65) Prior Publication Data

US 2007/0164788 A1 Jul. 19, 2007

(30) Foreign Application Priority Data

Dec. 22, 2005 (JP) .............................. 2005-371002

(51) Int. Cl.
*H01L 29/00* (2006.01)
*H01L 23/02* (2006.01)
*H01L 23/48* (2006.01)
*H01L 23/52* (2006.01)
*H01L 29/40* (2006.01)

(52) U.S. Cl. ........................ 257/678; 257/528; 257/778

(58) Field of Classification Search ......... 257/528–535, 257/678, 684, 777–778
See application file for complete search history.

(56) References Cited

U.S. PATENT DOCUMENTS

| 6,856,007 | B2 * | 2/2005 | Warner ......................... 257/678 |
| 7,230,316 | B2 * | 6/2007 | Yamazaki et al. ........... 257/531 |
| 7,268,426 | B2 * | 9/2007 | Warner et al. ................ 257/777 |

FOREIGN PATENT DOCUMENTS

| CN | 2678287 Y | 2/2005 |
| CN | 2742688 Y | 11/2005 |
| JP | 2004-228713 | 8/2004 |
| JP | 2005-6471 | 1/2005 |

* cited by examiner

*Primary Examiner*—Cuong Q Nguyen
(74) *Attorney, Agent, or Firm*—Oblon, Spivak, McClelland, Maier & Neustadt, P.C.

(57) ABSTRACT

A semiconductor device of an embodiment of the invention has a package substrate, and a semiconductor chip mounted on the package substrate. The semiconductor chip has an output section, and a filter section for decreasing the electromagnetic noise generated from the data communication path. The output section outputs a data signal into the data communication path, and has a buffer amplifier section for compensating the data signal.

16 Claims, 5 Drawing Sheets

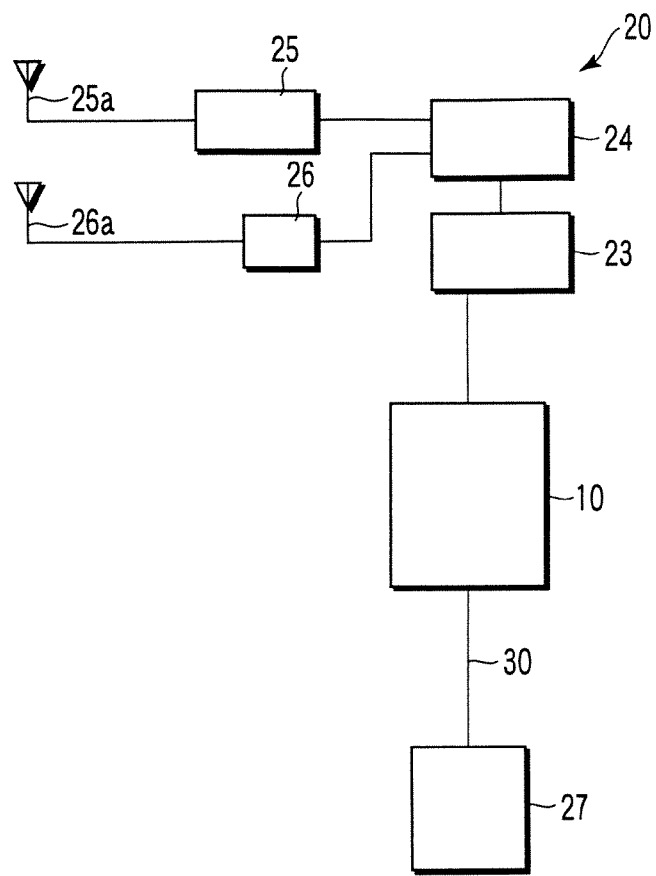
F I G. 2
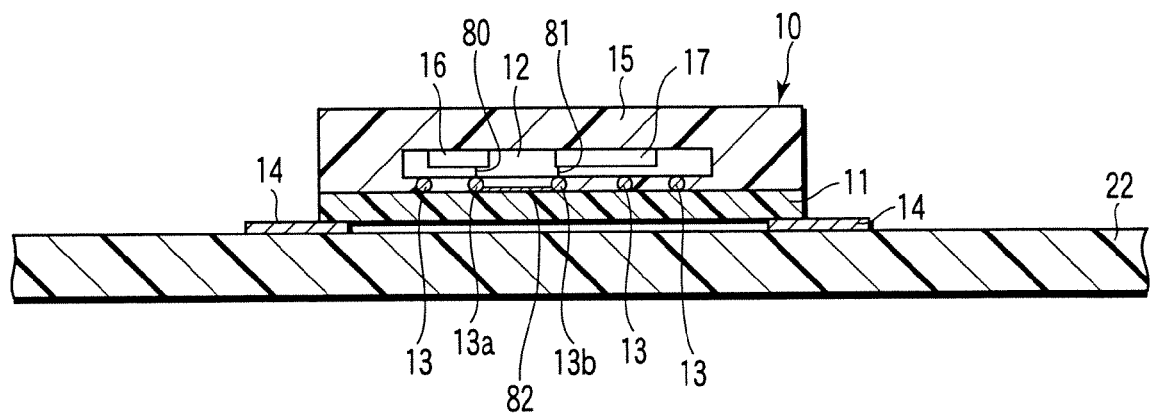
F I G. 3

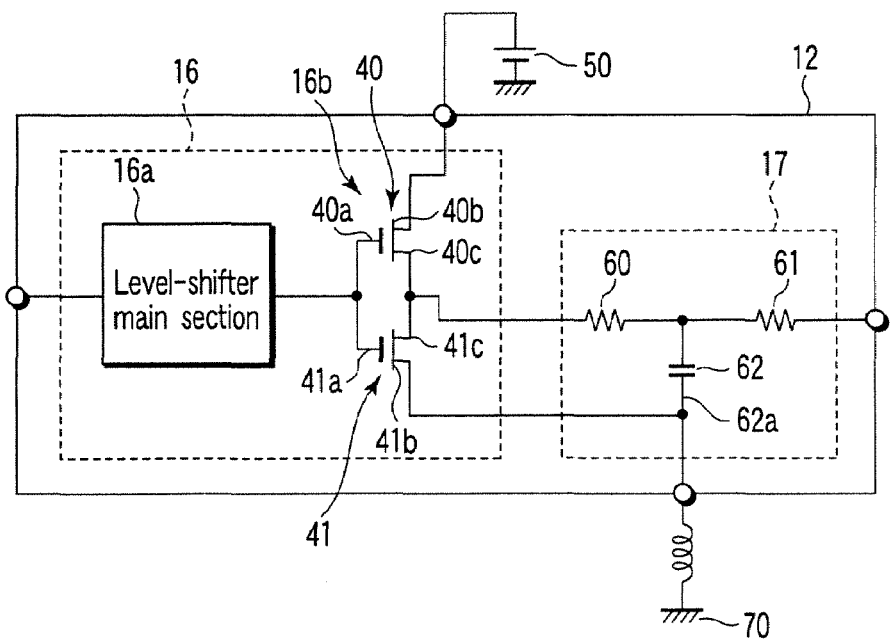
F I G. 4
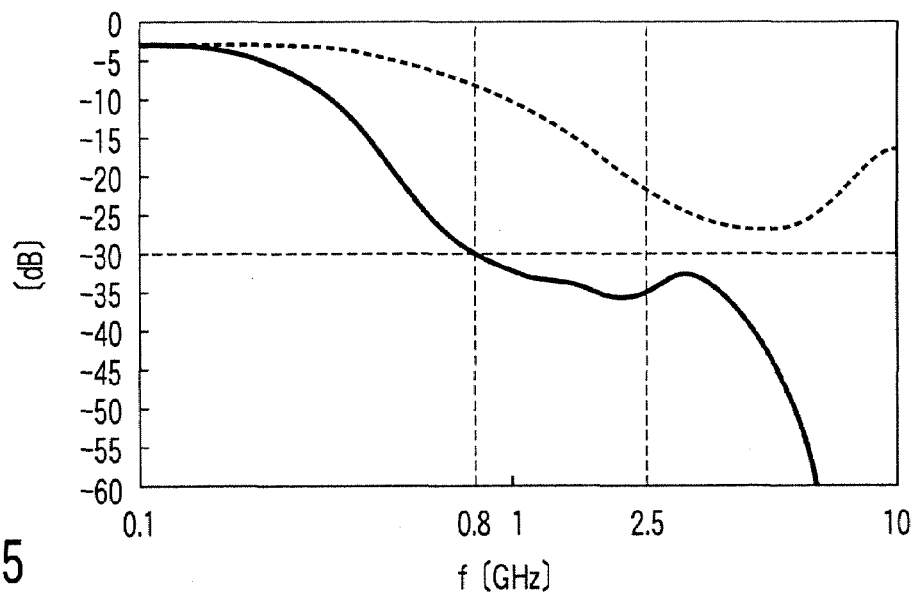
F I G. 5
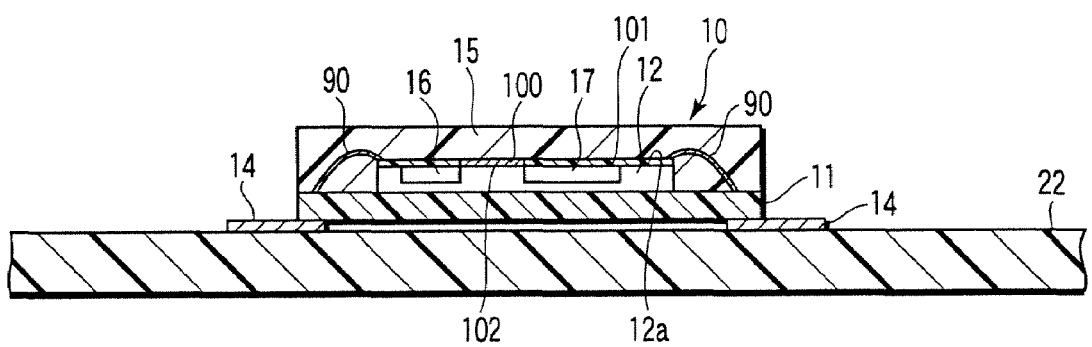
F I G. 6

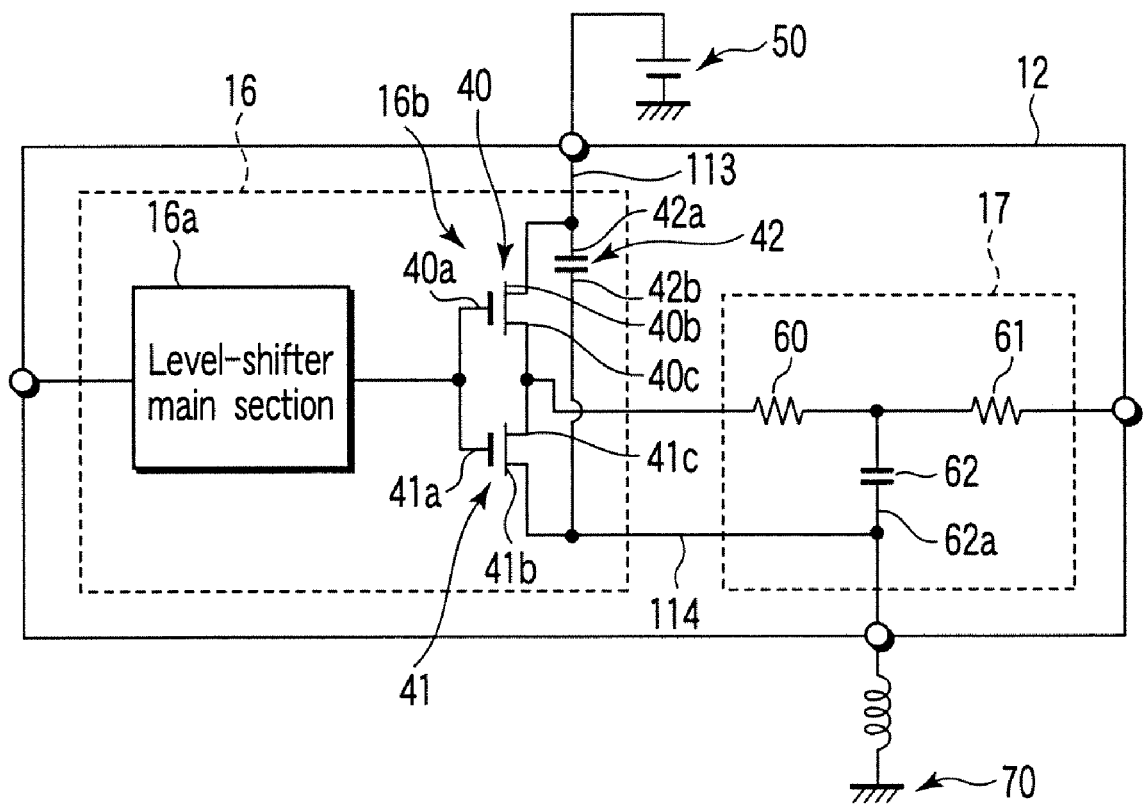
F I G. 9

SEMICONDUCTOR DEVICE AND ELECTRIC APPARATUS

CROSS-REFERENCE TO RELATED APPLICATIONS

This application is based upon and claims the benefit of priority from prior Japanese Patent Application No. 2005-371002, filed Dec. 22, 2005, the entire contents of which are incorporated herein by reference.

BACKGROUND OF THE INVENTION

1. Field of the Invention

The present invention relates to a semiconductor device having a filter function of reducing intensity of an electromagnetic noise generated from a data communication path. Moreover, the invention relates to an electric apparatus that exchanges data with a memory device via a semiconductor device having a filter function of reducing intensity of an electromagnetic noise generated from a data communication path.

2. Description of the Related Art

A mobile phone device has an electromagnetic compatibility (EMC) filter device provided in the data communication path between the CPU and the memory card. The EMC filter device prevents a high-frequency component of an electromagnetic noise generated from the data communication path from interfering with the electromagnetic wave which is used by the mobile phone. For example, Jpn. Pat. Appln. KOKAI Publications No. 2005-6471 and No. 2004-228713 disclose such a filter device.

Specifically, the EMC filter device is mounted in the data communication path formed between the CPU of the mobile phone device and the memory card. A level shifter device is mounted between the CPU and the EMC filter device.

The level shifter device has a function for adjusting both memory cards in the 1.8 V standard and the 3.0 V standard to the mobile phone device in the 1.8 V standard. Typically, the level shifter device has a buffer amplifier section for compensating voltage outputted for data communication. The buffer amplifier section is directly electrically connected to the EMC filter device.

The memory card currently stores data having comparatively large capacity such as music or image information. Therefore, a communication speed between the memory card and the mobile phone device tends to be increased.

However, when the communication speed between the memory card and the mobile phone device is increased, intensity of a high-frequency component of the electromagnetic noise generated from the data communication path is increased. As a result, even if intensity of the high-frequency component is reduced by the EMC filter, the high-frequency component still has sufficient intensity to obstruct transmission and reception of an electromagnetic wave for use in a telephone call and the like.

On the other hand, as a factor of reducing a filter characteristic of the EMC filter device, inductance is given, which is due to electrical connection between the EMC filter device and the level shifter device via ground.

This point is specifically described. The EMC filter device and the level shifter device are mounted on a mobile phone substrate. A terminal to be connected to ground in the EMC filter device is connected to ground on a package substrate, which configures the EMC filter device, via bonding wire.

Similarly, a terminal to be connected to ground in the level shifter device is connected to ground on a package substrate, which configures the level shifter device, via bonding wire. The ground of the EMC filter device is electrically connected to the ground of the level shifter device through wiring formed on the mobile phone substrate.

When the EMC filter device is electrically connected to the level shifter device via ground in this way, each connection path becomes long. Furthermore, since inductance of the bonding wire itself is large, a filter characteristic of the EMC filter device is reduced.

Therefore, a semiconductor chip configuring the EMC filter device is connected to the package substrate configuring the EMC filter device in a flip-chip manner via bumps. Thus, the terminal to be connected to ground in the EMC filter device is connected to the package substrate via bumps.

By connecting the EMC filter device in the flip-chip manner as above, bonding wire is not used. As a consequence, the electromagnetic noise can be further decreased by the EMC filter device.

By improving the filter characteristic of the EMC filter device in this way, a measure is taken for increase in intensity of the high-frequency component of the electromagnetic noise along with increase in data communication speed between the CPU and the memory card.

However, capacity of data stored in the memory card is considered to be more increased in the future. Therefore, a sufficient measure for the high-frequency component of the electromagnetic noise along with further increase in data communication speed is considered to be difficult only by improving the filter characteristic of the EMC filter device according to a technique in the prior art.

BRIEF SUMMARY OF THE INVENTION

It is desirable to provide a semiconductor device that can further effectively reduce intensity of a high-frequency component of an electromagnetic noise generated from a data communication path.

A semiconductor device of an embodiment of the invention has a package substrate, and a semiconductor chip mounted on the package substrate. The semiconductor chip has an output section, and a filter section for decreasing the electromagnetic noise generated from the data communication path. The output section outputs a data signal into the data communication path, and has a buffer amplifier section for compensating the data signal.

According to the above-described configuration, the output section and the filter section are formed on one semiconductor chip. Accordingly, inductance between a terminal to be connected to ground in the output section and a terminal to be connected to ground in the filter section is reduced, the inductance being a factor of reducing a filter characteristic of the filter section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a block diagram schematically showing the mobile phone device shown in FIG. 1;

FIG. 3 is a cross-sectional view taken along a line F3-F3 shown in FIG. 1;

FIG. 4 is an equivalent circuit diagram of a level shifter section and an EMC filter section shown in FIG. 3;

FIG. 5 is a graph showing a filter characteristic of the EMC filter section shown in FIG. 3;

FIG. 6 is a cross-sectional view of a semiconductor device according to a second embodiment of the invention;

FIG. 9 is an equivalent circuit diagram of a level shifter section and an EMC filter section of a semiconductor device according to a fourth embodiment of the invention.

DETAILED DESCRIPTION OF THE INVENTION

Figure 1:
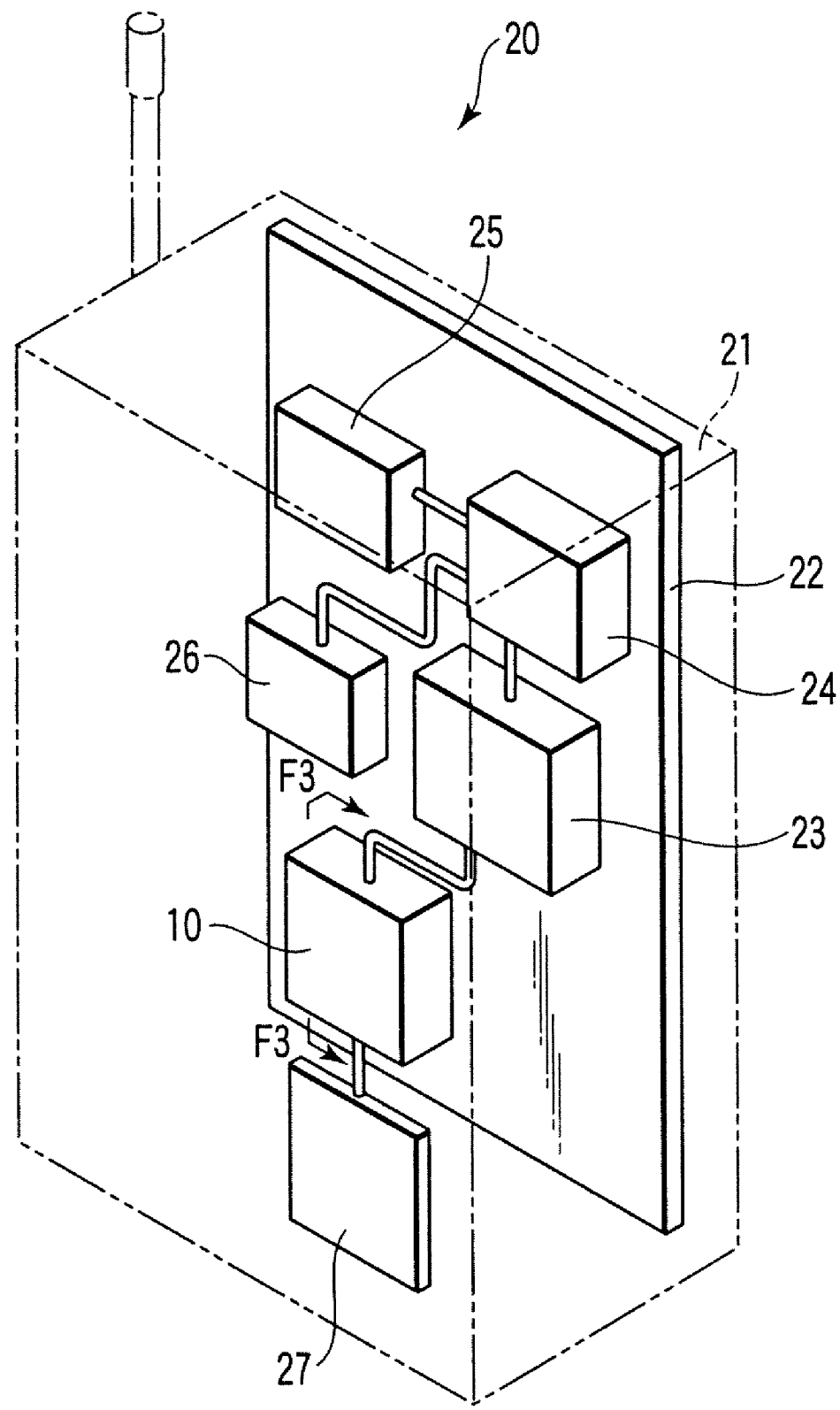
FIG. 1 is a perspective view schematically showing a mobile phone device having a semiconductor device according to a first embodiment of the invention.

A semiconductor device according to a first embodiment of the invention will be described with reference to FIGS. 1 to 5. In the embodiment, a semiconductor device 10 is used for a mobile phone device 20. FIG. 1 is a perspective view schematically showing the mobile phone device 20. The mobile phone device 20 is an example of an electric apparatus, as called in the embodiment of the invention.

As shown in FIG. 1, the mobile phone device 20 has a housing 21, a mobile phone substrate 22, a CPU 23, base band large scale integration (BBLSI) 24, a Bluetooth® chip set 25, a radio frequency integrated circuit (RFIC) 26, a memory card 27, and a semiconductor device 10. In FIG. 1, the housing 21 is shown by a chain double-dashed line.

The CPU 23, BBLSI 24, Bluetooth chip set 25, RFIC 26, and semiconductor device 10 are mounted on the mobile phone substrate 22. The mobile phone substrate 22 is stored in the housing 21.

FIG. 2 is a block diagram schematically showing the mobile phone device 20. As shown in FIG. 2, the CPU 23 is electrically connected to the BBLSI 24. The BBLSI 24 is electrically connected to the RFIC 26. The RFIC 26 has an antenna 26a. The antenna 26a transmits or receives an electromagnetic wave for use in a telephone call.

The CPU 23 is electrically connected to the semiconductor device 10. The BBLSI 24 is electrically connected to the Bluetooth chip set 25. The Bluetooth chip set 25 has an antenna 25a for transmitting or receiving an electromagnetic wave.

The memory card 27 is electrically connected to the CPU 23 from the outside in a detachable manner. The CPU 23 is an example of a communication device, as called in the embodiment of the invention. The memory card 27 is an example of a memory device, as called in the embodiment of the invention. A data communication path 30 for communicating data between the memory card 27 and the CPU 23 is formed in the mobile phone substrate 22. The semiconductor device 10 is mounted in the data communication path 30.

FIG. 3 is a cross-sectional view along a line F3-F3 shown in FIG. 1. FIG. 3 is a cross-sectional view of the semiconductor device 10. As shown in FIG. 3, the semiconductor device 10 has a package substrate 11 and a semiconductor chip 12.

The package substrate 11 is connected onto the mobile phone substrate 22 by using, for example, solder 14. The semiconductor chip 12 is connected onto the package substrate 11 in a flip-chip manner by using a plurality of bumps 13. The semiconductor device 10 is resin-sealed by resin 15.

In the semiconductor 12, a level shifter section 16 and an EMC filter section 17 are formed.

The level shifter section 16 has a function of controlling voltage during transmission and reception of data between the CPU 23 and the memory card 27 and then outputting the voltage, in order to adjust both the memory cards 27 in the 1.8 V standard and the 3.0 V standard to the mobile phone device in the 1.8 V standard. The level shifter section 16 is an example of an output section, as called in the embodiment of the invention.

The electromagnetic compatibility (EMC) filter section 17 has a function of decreasing an electromagnetic noise generated from the data communication path 30. The EMC filter section 17 is a filter section, as called in the embodiment of the invention.

FIG. 4 shows the level shifter section 16 and the EMC filter section 17 in an equivalent circuit. As shown in FIG. 4, the level shifter section 16 has a level-shifter main section 16a for adjusting voltage, and a buffer amplifier section 16b. Voltage outputted from the level-shifter main section 16a is sometimes reduced. The buffer amplifier section 16b has a function of compensating such a reduced output.

The buffer amplifier section 16b is configured by series connection of a PMOSFET element 40 and an NMOSFET element 41. A gate 40a of the PMOSFET element 40 and a gate 41a of the NMOSFET element 41 are electrically connected to each other. Respective gates 40a and 41a are electrically connected to the level-shifter main section 16a.

A source terminal 40b of the PMOSFET element 40 is connected to an external power supply 50. A source terminal 41b of the NMOSFET element 41 is a terminal to be connected to ground called in the embodiment of the invention. A drain terminal 40c of the PMOSFET element 40 and a drain terminal 41c of the NMOSFET element 41 are output terminals.

The EMC filter section 17 has a first resistance element 60 connected to respective terminals 40c and 41c, a second resistance element 61 and a capacitor element 62 connected to the first resistance element 60. The second resistance element 61 and the capacitor element 62 are in parallel. The other end 62a of the capacitor element 62 is a terminal to be connected to a ground 70, as called in the embodiment of the invention. The source terminal 41b of the NMOSFET element 41 of the buffer amplifier section 16b is connected to the other end 62a of the capacitor element 62.

The source terminal 41b of the NMOSFET element 41 of the buffer amplifier section 16b is short-circuited to the other end 62a of the capacitor element 62 through first to third wiring lines 80 to 82. This point is specifically described. As shown in FIG. 3, the source terminal 41b of the NMOSFET element 41 is electrically connected to a first bump 13a of the plurality of bumps 13, the first bump being approximately directly below the source terminal 41b of the NMOSFET element 41.

While the source terminal 41b of the NMOSFET element 41 and the first bump 13a are electrically connected to each other via the first wiring line 80 in the embodiment, this is not restrictive. For example, the source terminal 41b of the NMOSFET element 41 may be directly connected to the first bump 13a.

The other end 62a of the capacitor element 62 is electrically connected to, for example, a second bump 13b of the plurality of bumps 13, the second bump being approximately directly below the other end 62a of the capacitor element 62. While the other end 62a of the capacitor element 62 is electrically connected to the second bump 13b via the second wiring line 81 in the embodiment, this is not restrictive. For example, the other end 62a of the capacitor element 62 may be electrically connected to the second bump 13b.

The first and second bumps 13a and 13b are electrically short-circuited to each other through the third wiring line 82 formed on the package substrate 11. The first to third wiring lines 80 to 82 are approximately straight. The third wiring line 82 is a wiring line formed on the package substrate, as called in the embodiment of the invention.

In the buffer amplifier section 16b and the EMC filter section 17 configured as above, the PMOSFET element 40 is turned off and the NMOSFET element 41 is short-circuited when voltage is applied to the buffer amplifier section 16b. Accordingly, voltage applied to the EMC filter section 17 is 0 V.

Moreover, when voltage of the buffer amplifier section 16b is 0 V, the PMOSFET element 40 is turned on, and the NMOSFET element 41 is in an off-state, and consequently, voltage from the external power supply 50 is outputted to the EMC filter section 17.

Configurations of the level shifter section 16 and the EMC filter section 17 are not limited to configurations described above. The above-described configurations of the level shifter section 16 and the EMC filter section 17 are merely an example.

In a word, the terminal to be connected to ground in the buffer amplifier section 16b can be short-circuited to the terminal to be connected to ground in the EMC filter section 17.

The source terminal 41b of the NMOSFET 41, or the terminal to be connected to ground in the buffer amplifier section 16b is short-circuited to the other end 62a of the capacitor element 62, or the terminal to be connected to ground 70 in the EMC filter section 17 through an area on the package substrate 11. As a consequence, a path for electrically connecting the source terminal 41b and the other end 62a of the capacitor element 62 is shortened.

Accordingly, inductance of a path for electrically connecting the source terminal 41b and the other end 62a of the capacitor element 62 can be reduced.

Next, a filter characteristic of the EMC filter section 17 is described. FIG. 5 is a graph showing the filter characteristic of the EMC filter section 17. A horizontal axis of the graph shown in FIG. 5 indicates frequency components of an electromagnetic noise generated from the data communication path 30 during data communication between the memory card 27 and the CPU 23. A vertical axis of the graph shown in FIG. 5 indicates noise reduction achieved by the EMC filter section 17.

As shown in FIG. 5, according to the embodiment, a reduction level of 30 dB or more is obtained in 800 MHz to 2.5 GHz as a frequency band which is generally used for the mobile phone device 20. A graph shown in a dot line in FIG. 5 indicates a reduction level of each frequency component in an electromagnetic noise in the case of including a semiconductor device having the same function as that of the level shifter section 16 and a semiconductor device having the same function as that of the EMC filter section 17, instead of the semiconductor device 10.

If the semiconductor device having the same function as that of the level shifter section 16 and the semiconductor device having the same function as that of the EMC filter section 17 are separately included instead of the semiconductor device 10, the path for electrically connecting the source terminal 41b and the other end 62a of the capacitor element 62 becomes long. Therefore, inductance of the path is comparatively large.

According to the configuration as above, the level shifter section 16 and the EMC filter section 17 are formed on one semiconductor chip 12. As a result, the path can be shortened which electrically connects the source terminal 41b of the NMOSFET element 41 of the level shifter section 16 and the other end 62a of the capacitor element 62 of the EMC filter section 17. For this reason, it is possible to reduce inductance between the terminal to be connected to ground in the level shifter section 16 and the terminal to be connected to ground in the EMC filter section 17.

That is, since the inductance between the terminal to be connected to ground in the level shifter section 16 and the terminal to be connected to ground in the EMC filter section 17 is reduced, the inductance being a factor of reducing the filter characteristic of the EMC filter section 17, the EMC filter section 17 can sufficiently decrease the high-frequency component of the electromagnetic nose generated from the data communication path 30.

Moreover, the source terminal 41b of the NMOSFET element 41 of the level shifter section 16 and the other end 62a of the capacitor element 62 of the EMC filter section 17 are short-circuited on the package substrate 11. As a consequence, the path for electrically connecting the source terminal 41b of the NMOSFET element 41 and the other end 62a of the capacitor element 62 of the EMC filter section 17 can be effectively shortened.

Moreover, the first to third wiring lines 80 to 82 are made straight, thereby the path for electrically connecting the source terminal 41b and the other end 62a of the capacitor element 62 of the EMC filter section 17 can be effectively shortened.

Next, a semiconductor device 10 according to a second embodiment of the invention will be described with reference to FIG. 6. The same functional components as those in the first embodiment are denoted by the same reference numerals, and the description thereof is omitted. The embodiment is different from the first embodiment in a structure of the path for electrically connecting the source terminal 41b of the NMOSFET element 41 of the level shifter section 16 and the other end 62a of the capacitor element 62 of the EMC filter section 17. Other structures may be the same as those in the first embodiment. The above different point is specifically described.

FIG. 6 is a cross-sectional view of the semiconductor device 10 of the embodiment. As shown in FIG. 6, in the embodiment, the semiconductor chip 12 is electrically connected to the package substrate 11 by using a bonding wire 90 rather than flip-chip connection.

In the embodiment, a thin-film wiring layer 101 is formed on a main surface 12a of the semiconductor chip 12. A wiring pattern 102 is formed in the thin-film wiring layer 101. The wiring pattern 102 is formed at the main surface 12a side. In the figure, a thin-film wiring line 100 as a part of the wiring pattern 102 is shown. The source terminal 41b of the NMOSFET element 41 of the level shifter section 16 and the other end 62*a* of the capacitor element 62 of the EMC filter section 17 are electrically short-circuited to each other by the thin-film wiring line 100. The thin-film wiring line 100 is a part of the wiring pattern of the thin-film wiring layer, as called in the embodiment of the invention.

The thin-film wiring line 100 connects the source terminal 41*b* of the NMOSFET element 41 of the level shifter section 16 and the other end 62*a* of the capacitor element 62 of the EMC filter section 17 approximately straightly. Therefore, the wiring pattern 102 is formed so as to include a straight line connecting the source terminal 41*b* of the NMOSFET element 41 and the other end 62*a* of the capacitor element 62 of the EMC filter section 17.

In the embodiment, the path for electrically connecting the source terminal 41*b* of the NMOSFET element 41 of the level shifter section 16 and the other end 62*a* of the capacitor element 62 of the EMC filter section 17 is formed on the semiconductor chip 12. As a consequence, a path for electrically short-circuiting the source terminal 41*b* of the NMOSFET element 41 and the other end 62*a* of the capacitor element 62 of the EMC filter section 17 can be further shortened.

Accordingly, it is possible to further reduce inductance of the path for electrically connecting between the source terminal 41*b* of the NMOSFET element 41 and the other end 62*a* of the capacitor element 62 of the EMC filter section 17. As a result, in addition to advantages of the first embodiment, the EMC filter section 17 can efficiently reduce intensity of the high-frequency component of the electromagnetic noise.

Since the thin-film wiring line 100 is straight, the path for electrically connecting the source terminal 41*b* of the NMOSFET element 41 and the other end 62*a* of the capacitor element 62 of the EMC filter section 17 can be further shortened. Accordingly, inductance of the path can be further reduced. As a result, in addition to advantages of the first embodiment, the EMC filter section 17 can efficiently reduce intensity of the high-frequency component of the electromagnetic noise.

Next, a semiconductor device 10 according to a third embodiment of the invention will be described with reference to FIGS. 7 and 8. The same functional components as those in the first embodiment are denoted by the same reference numerals, and the description thereof is omitted. The embodiment is different from the first embodiment in that the semiconductor device 10 has a capacitor element 42. Other structures may be the same as those in the first embodiment. The above different point is specifically described.

Figure 7:
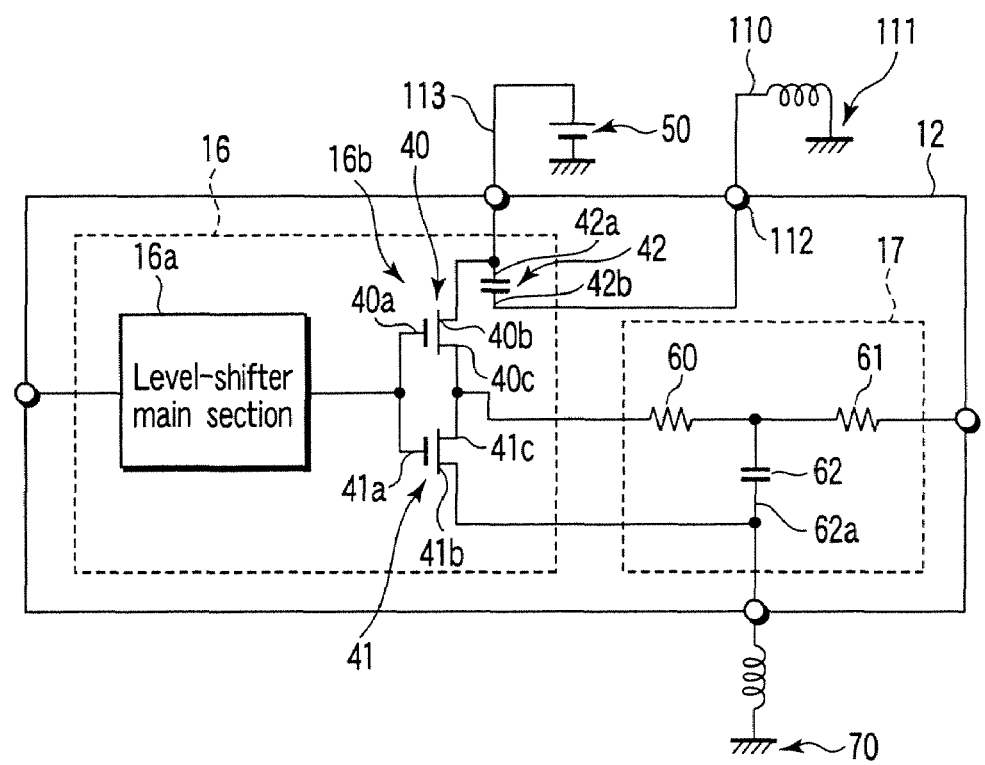
FIG. 7 is an equivalent circuit diagram of a level shifter section and an EMC filter section of a semiconductor device according to a third embodiment of the invention.

FIG. 7 is an equivalent circuit diagram showing a level shifter section 16 and an EMC filter section 17 of the embodiment. As shown in FIG. 7, the semiconductor chip 12 has a capacitor element 42 within the chip. One end 42*a* of the capacitor element 42 is electrically connected to a wiring portion 113 for electrically connecting the source terminal 40*b* of the PMOSFET element 40 of the level shifter 16 and the external power supply 50.

The other end 42*b* of the capacitor element 42 is connected to a terminal 112 provided on a surface of the semiconductor chip 12, and electrically connected to ground 111 provided in the package substrate 11 via a bonding wire 110 connected to the relevant terminal 112.

Figure 8:
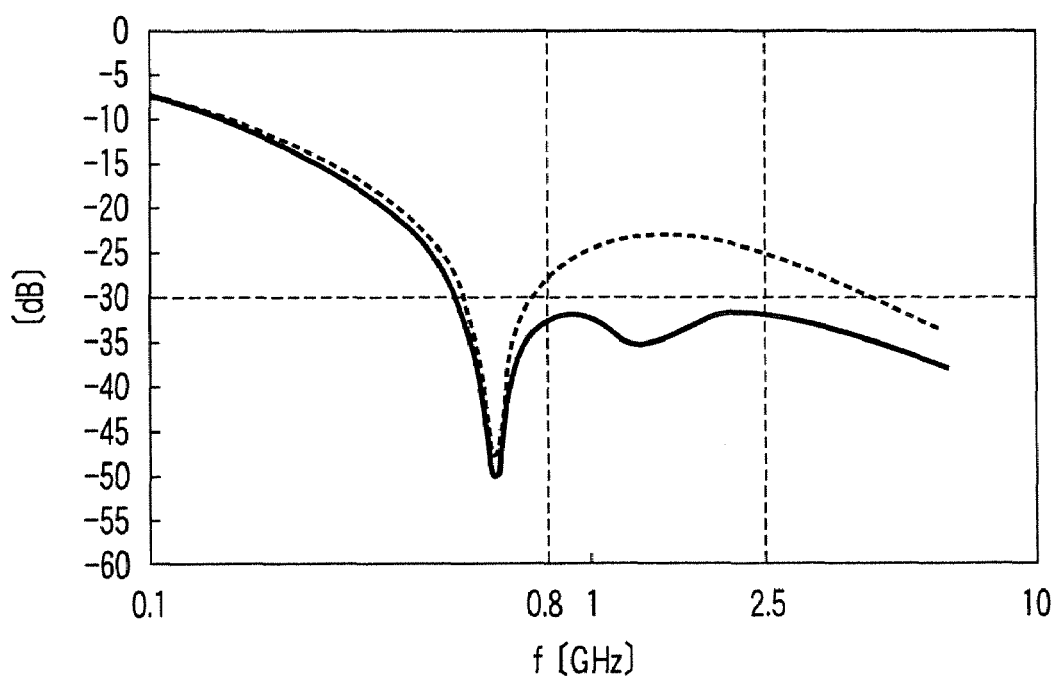
FIG. 8 is a graph showing a reduction level of each frequency component of an electromagnetic noise when an electromagnetic noise is mixed in a buffer amplifier section shown in FIG. 7 from a wiring pattern to be connected to an external power supply for supplying power to the relevant buffer amplifier section, the electromagnetic noise being generated from a data communication path due to the mixed electromagnetic noise.

FIG. 8 shows a reduction level of each frequency component of an electromagnetic noise when an electromagnetic noise is mixed in the buffer amplifier section 16*b* from the wiring portion 113 to be connected to the external power supply 50 for supplying power to the relevant buffer amplifier section 16*b*, the electromagnetic noise being generated from the data communication path 30 due to the mixed electromagnetic noise.

In the figure, a horizontal axis indicates a frequency component. A vertical axis shows a reduction level of the electromagnetic noise, which is reduced by the EMC filter section 17, generated from the data communication path 30 due to the electromagnetic noise mixed from the wiring portion 113.

A graph shown by a dot line in the figure indicates a reduction level of each frequency component of the electromagnetic noise generated from the data communication path 30 due to the electromagnetic noise mixed from the wiring portion 113 in the case that the capacitor element 42 is not provided in the semiconductor device 10.

A graph shown by a solid line in the figure indicates a reduction level of each frequency component of the electromagnetic noise generated from the data communication path 30 due to the noise mixed from the wiring portion 113 in the case that the capacitor element 42 is provided in the semiconductor device 10.

As shown by the dot line in FIG. 8, in the case that the capacitor element 42 is not provided, the electromagnetic noise mixed from the wiring portion 113 is reduced by approximately 23 dB in the frequency band of 800 MHz to 2.5 GHz by passing through the EMC filter section 17. On the contrary, in the case that the capacitor element 42 is provided, it is reduced by 30 dB or more in the frequency band of 800 MHz to 2.5 GHz.

In the embodiment, in addition to the advantages of the first embodiment, a filter function of the capacitor element 42 provides the following advantage. That is, even if the electromagnetic noise is mixed from the wiring portion 113, or a power line connecting the external power supply 50 and the buffer amplifier section 16*b*, frequency components in the frequency band of 800 MHz to 2.5 GHz for use in the mobile phone device 20 in an electromagnetic noise generated from the data communication path 30 due to the mixed electromagnetic noise are reduced by 30 dB or more. Furthermore, since the capacitor element 42 is incorporated into the semiconductor chip 12, the number of components of the semiconductor device 10 is not increased.

Even if the capacitor element 42 of the embodiment is used in the semiconductor device 10 described in the second embodiment, similar advantages can be obtained.

Next, a semiconductor device according to a fourth embodiment of the invention will be described with reference to FIG. 9. The same functional components as those in the third embodiment are denoted by the same reference numerals, and the description thereof is omitted. The embodiment is different from the third embodiment in a connection target of the other end 42*b* of the capacitor element 42. Other structures can be the same as those in the third embodiment. The above different structure is specifically described.

FIG. 9 is an equivalent circuit diagram showing a level shifter section 16 and an EMC filter section 17 of the embodiment. As shown in FIG. 9, the other end 42*b* of the capacitor element 42 is connected to a wiring portion 114 for connecting the source terminal 41*b* of the NMOSFET element 41 and the ground 70. In other word, the other end 42*b* is electrically connected to the ground 70 via the wiring portion 114.

Even if the capacitor element 42 is indirectly connected to ground via a terminal to be connected to ground or a wiring pattern as the embodiment, the same advantages as those in the third embodiment can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a package substrate; and
a semiconductor chip mounted on the package substrate, the semiconductor chip comprising: an output section which outputs a data signal into a data communication path and has a buffer amplifier section which compensates the data signal; and a filter section which decreases an electromagnetic noise generated from the data communication path, a terminal to be connected to ground in the buffer amplifier section being electrically short-circuited to a terminal to be connected to ground in the filter section.

2. The semiconductor device according to claim 1, wherein a terminal to be connected to ground in the buffer amplifier section is electrically short-circuited to a terminal to be connected to ground in the filter section by a straight wiring line formed on the package substrate.

3. The semiconductor device according to claim 1, wherein a terminal to be connected to ground in the buffer amplifier section is electrically short-circuited to a terminal to be connected to ground in the filter section by a wiring pattern of a thin-film wiring layer formed on a main surface of the semiconductor chip.

4. The semiconductor device according to claim 3, wherein the wiring pattern is formed such that a virtual straight line is included, the virtual straight line connecting the terminal to be connected to ground in the buffer amplifier section and the terminal to be connected to ground in the filter section.

5. The semiconductor device according to claim 1, wherein a capacitor element is electrically connected a wiring line and ground, the wiring line connecting the buffer amplifier section to a power supply.

6. The semiconductor device according to claim 2, wherein a capacitor element is electrically connected a wiring line and ground, the wiring line connecting the buffer amplifier section to a power supply.

7. The semiconductor device according to claim 3, wherein a capacitor element is electrically connected a wiring line and ground, the wiring line connecting the buffer amplifier section to a power supply.

8. The semiconductor device according to claim 4, wherein a capacitor element is electrically connected a wiring line and ground, the wiring line connecting the buffer amplifier section to a power supply.

9. An electric apparatus comprising:
the semiconductor device according to claim 1; and
a communication device, the communication device exchanging data with a memory device provided in a detachable manner via the semiconductor device.

10. An electric apparatus comprising:
the semiconductor device according to claim 2; and
a communication device, the communication device exchanging data with a memory device provided in a detachable manner via the semiconductor device.

11. An electric apparatus comprising:
the semiconductor device according to claim 3; and
a communication device, the communication device exchanging data with a memory device provided in a detachable manner via the semiconductor device.

12. An electric apparatus comprising:
the semiconductor device according to claim 4; and
a communication device, the communication device exchanging data with a memory device provided in a detachable manner via the semiconductor device.

13. An electric apparatus comprising:
the semiconductor device according to claim 5; and
a communication device, the communication device exchanging data with a memory device provided in a detachable manner via the semiconductor device.

14. An electric apparatus comprising:
the semiconductor device according to claim 6; and
a communication device, the communication device exchanging data with a memory device provided in a detachable manner via the semiconductor device.

15. An electric apparatus comprising:
the semiconductor device according to claim 7; and
a communication device, the communication device exchanging data with a memory device provided in a detachable manner via the semiconductor device.

16. An electric apparatus comprising:
the semiconductor device according to claim 8; and
a communication device, the communication device exchanging data with a memory device provided in a detachable manner via the semiconductor device.

* * * * *